(12) United States Patent
Dogi et al.

(10) Patent No.: US 7,967,961 B2
(45) Date of Patent: Jun. 28, 2011

(54) FILM FORMING APPARATUS

(75) Inventors: Minoru Dogi, Kanagawa (JP); Hideyuki Odagi, Kanagawa (JP); Tetsuya Shimada, Kanagawa (JP); Masahiro Matsumoto, Chiba (JP)

(73) Assignee: Ulvac, Inc, Kanagawa (JP)

( * ) Notice: Subject to any disclaimer, the term of this patent is extended or adjusted under 35 U.S.C. 154(b) by 952 days.

(21) Appl. No.: 11/661,084

(22) PCT Filed: Aug. 29, 2005

(86) PCT No.: PCT/JP2005/015673
§ 371 (c)(1),
(2), (4) Date: Sep. 18, 2007

(87) PCT Pub. No.: WO2006/025336
PCT Pub. Date: Mar. 9, 2006

(65) Prior Publication Data
US 2008/0164147 A1 Jul. 10, 2008

(30) Foreign Application Priority Data
Aug. 30, 2004 (JP) .................................. 2004-249627

(51) Int. Cl.
*C23C 14/34* (2006.01)
(52) U.S. Cl. ......... 204/298.25; 204/298.11; 204/298.28; 204/298.15
(58) Field of Classification Search ............. 204/298.11, 204/298.25, 298.28, 298.15
See application file for complete search history.

(56) References Cited

U.S. PATENT DOCUMENTS

| | | | |
|---|---|---|---|
| 3,796,649 A | | 3/1974 | Lamont, Jr. et al. |
| 5,421,979 A | * | 6/1995 | Stevenson ................ 204/298.25 |
| 6,231,732 B1 | * | 5/2001 | Hollars et al. ........... 204/298.26 |
| 6,453,543 B1 | * | 9/2002 | Tinner et al. ..................... 29/607 |

FOREIGN PATENT DOCUMENTS

| | | |
|---|---|---|
| CN | 1489782 A | 4/2004 |
| EP | 0 725 162 A2 | 8/1996 |
| EP | 0 858 963 A2 | 8/1998 |
| JP | 60-211068 A | 10/1985 |
| JP | 60211068 A | 10/1985 |
| JP | 4-110457 A | 4/1992 |
| JP | 04-110457 A | 4/1992 |

(Continued)

*Primary Examiner* — Rodney G McDonald
(74) *Attorney, Agent, or Firm* — Arent Fox LLP

(57) ABSTRACT

There is provided a film forming apparatus which is capable of forming a film on both surfaces of a substrate by sputtering continuously with high efficiency by restraining a rise in temperature of the substrate to a predetermined value or higher.
In a film forming chamber 2 the pressure of which is controlled, while a rotating drum 7 is rotated by the driving of a drive motor 8, a film is formed on the top surface of a substrate 12 on a substrate tray 13 held on a substrate holder 10 by cathodes 17a and 17b for outer surface to which a d.c. voltage or an a.c. voltage or a high-frequency voltage is applied, and also a film is formed on the back surface of the substrate 12 on the substrate tray 13 held on the substrate holder 10 by cathodes 14a and 14b for inner surface to which a d.c. voltage or an a.c. voltage or a high-frequency voltage is applied, by which a high-quality film is formed on both surfaces of the substrate 12 by sputtering continuously with high efficiency by restraining a rise in temperature of the substrate to a predetermined value or higher.

27 Claims, 4 Drawing Sheets

FOREIGN PATENT DOCUMENTS

| | | |
|---|---|---|
| JP | 5-156436 A | 6/1993 |
| JP | 7-62532 A | 3/1995 |
| JP | 10317170 A | 12/1998 |
| JP | 2000-129435 A | 5/2000 |
| JP | 2002-332570 A | 11/2002 |
| RU | 1 066 230 A1 | 9/1995 |
| SU | 290065 A | 2/1971 |
| WO | WO-9626532 A1 | 8/1996 |

* cited by examiner

FILM FORMING APPARATUS

CROSS-REFERENCE TO RELATED APPLICATION

This application is a National Stage entry of International Application No. PCT/JP2005/015673, filed Aug. 29, 2005, the entire specification claims and drawings of which are incorporated herewith by reference.

TECHNICAL FIELD

The present invention relates to a film forming apparatus. More particularly, it relates to a film forming apparatus in which a film is formed on both surfaces of a substrate by the sputtering technique.

BACKGROUND ART

In the case where a thin film is formed on a substrate, a sputtering system in which a thin film is formed on a substrate by the sputtering technique has conventionally been used. Generally, the sputtering system forms a thin film on one side of a substrate by the sputtering technique. However, a sputtering system in which targets are placed so as to face both surfaces of a substrate and a thin film is formed on both surfaces of substrate by the sputtering technique has also been proposed (for example, refer to Patent Document 1).
Patent Document 1: Japanese Patent Laid-Open No. 5-295538 (FIG. 1)

In the conventional sputtering system (film forming apparatus) described in Patent Document 1, when a substrate subjected to double-side film forming is transported out of a vacuum vessel (film forming chamber) and when an untreated substrate is transported into the vacuum vessel (film forming chamber), it is necessary to exhaust the vacuum vessel to control the pressure therein to a predetermined value by opening the vacuum vessel to the atmosphere before an untreated substrate is transported into the vacuum vessel and a double-side film forming process is performed, so that double-side film forming cannot be carried out continuously with high efficiency.

Also, in the sputtering system (film forming apparatus) capable of carrying out double-side film forming as described in Patent Document 1, in order to obtain a high-quality thin film, it is necessary to prevent the temperature of substrate from being raised to a predetermined value or higher by plasma generating at the time of film forming or by radiation heat from the cathode. However, it is difficult to provide a cooling means on the substrate because a film is formed on both surfaces of the substrate.

Accordingly, an object of the present invention is to provide a film forming apparatus which is capable of forming a high-quality film on both surfaces of a substrate by sputtering continuously with high efficiency by restraining a rise in temperature of the substrate to a predetermined value or higher.

DISCLOSURE OF THE INVENTION

To achieve the above object, of the film forming apparatus in accordance with the present invention, an invention described in claim 1 provides a film forming apparatus including a circular or polygonal cylindrical rotating body which is rotatably provided in a film forming chamber the pressure of which can be controlled; a rotating body driving means for rotationally driving the cylindrical rotating body; a first sputter film forming means provided so as to face the outer surface side of the cylindrical rotating body; a second sputter film forming means provided so as to face the inner surface side of the cylindrical rotating body; a substrate tray on which a substrate is placed so that the edge portions of the substrate are held and the top surface and the back surface of the substrate are exposed; and a substrate holder which is provided in an opening formed in the peripheral surface of the cylindrical rotating body to detachably hold the substrate tray so that the top surface and the back surface of the substrate are exposed, wherein a film is formed on the top surface of the substrate on the substrate tray held on the substrate holder by using the first sputter film forming means, and a film is formed on the back surface of the substrate on the substrate tray held on the substrate holder by using the second sputter film forming means, in the film forming chamber the pressure of which is controlled, while the cylindrical rotating body is rotated by the driving of the rotating body driving means.

Also, in an invention described in claim 2, in addition to the above-described configuration, the cylindrical rotating body is provided so that the axis line direction thereof is substantially horizontal.

Further, in an invention described in claim 3, a plurality of the substrate holders are provided along the circumferential direction of the cylindrical rotating body.

Also, in an invention described in claim 4, a substrate mounting/demounting means for mounting and demounting the substrate tray on and from the substrate holder is provided in the film forming chamber.

Also, in an invention described in claim 5, the substrate holder has a magnet, and the substrate tray has magnetism, and further the substrate mounting/demounting means has an electromagnet the magnetic force of which is larger than that of the magnet; when the substrate tray is mounted on the substrate holder, the electromagnet is deenergized, and the substrate tray held on the substrate mounting/demounting means is moved to the substrate holder side, and the substrate tray having magnetism is brought close to the magnet, by which the substrate tray is held on the substrate holder by the magnetic force due to the magnet; and when the substrate tray is demounted from the substrate holder, the substrate mounting/demounting means is moved close to the substrate holder, and the electromagnet is energized, by which the substrate tray is separated from the substrate holder by the magnetic force due to the electromagnet against the magnetic force due to the magnet, and the substrate tray is held on the substrate mounting/demounting means by the magnetic force due to the electromagnet.

Also, in an invention described in claim 6, a plurality of the first sputter film forming means are provided so as to face the outer surface side of the cylindrical rotating body with predetermined intervals being provided, and a plurality of the second sputter film forming means are provided so as to face the inner surface side of the cylindrical rotating body with predetermined intervals being provided.

Further, in an invention described in claim 7, in a transportation chamber provided adjacently to the film forming chamber via a sluice valve, there is provided a substrate tray transporting means which transports the substrate tray from the transportation chamber to the substrate mounting/demounting means in the film forming chamber through the sluice valve in a state in which the pressures in the film forming chamber and the transportation chamber are controlled, and also transports the substrate tray from the substrate mounting/demounting means in the film forming chamber to the transportation chamber through the opened sluice valve.

Also, in an invention described in claim 8, a feed/discharge chamber having a shelf for storing the substrate tray is provided adjacently to the transportation chamber via a sluice valve, so that the substrate tray is transported from the transportation chamber onto the shelf in the feed/discharge chamber through the opened sluice valve by the substrate tray transporting means in a state in which the pressures in the transportation chamber and the feed/discharge chamber are controlled, and also the substrate tray stored on the shelf is transported into the transportation chamber.

An invention described in claim 9 provides a film forming apparatus for forming a film on a substrate in a vacuum vessel, having a circular or polygonal cylindrical rotating body provided rotatably; a substrate tray which holds the substrate and is detachably fixed on the inner surface of the cylindrical rotating body; and a film forming means provided so as to face the outer peripheral surface of the cylindrical rotating body, wherein the cylindrical rotating body has an opening at least in a portion corresponding to the film forming range of the substrate, and a film is formed on the substrate while the cylindrical rotating body is rotated.

An invention described in claim 10 provides a film forming apparatus for forming a film on a substrate in a vacuum vessel, having a circular or polygonal cylindrical rotating body provided rotatably; a substrate tray which holds the substrate and is detachably fixed on the inner surface of the cylindrical rotating body; and a film forming means provided so as to face the inner peripheral surface of the cylindrical rotating body, wherein a film is formed on the substrate while the cylindrical rotating body is rotated.

In an invention described in claim 11, the cylindrical rotating body or the substrate tray has a magnet, and the substrate tray is fixed on the inner surface of the cylindrical rotating body by a magnetic force.

In an invention described in claim 12, a substrate mounting/demounting means for transferring the substrate tray to the inside of the cylindrical rotating body is provided; the substrate mounting/demounting means has an electromagnet having a magnetic force larger than that of the magnet; and when the substrate tray is held on the inner surface of the cylindrical rotating body, the electromagnet is deenergized, and when the substrate tray is removed from the inner surface of the cylindrical rotating body and is held by the substrate mounting/demounting means, the electromagnet is energized.

In an invention described in claim 13, the cylindrical rotating body is rotated around a substantially horizontal rotation axis.

ADVANTAGES OF THE INVENTION

According to the present invention, in the film forming chamber the pressure of which is controlled, while the cylindrical rotating body is rotated by the driving of the rotating body driving means, a film is formed on the top surface of the substrate on the substrate tray held on the substrate holder by using the first sputter film forming means, and also a film is formed on the back surface of the substrate on the substrate tray held on the substrate holder by using the second sputter film forming means.

Thereby, a period in which the film is formed and a period in which the film is not formed are repeated, and the substrate is cooled in the period in which the film is not formed. Therefore, a high-quality film can be formed not only on one surface but also on both surfaces of the substrate by sputtering continuously with high efficiency by restraining a rise in temperature of the substrate to a predetermined value or higher.

Further, since a plurality of substrates are mounted on the cylindrical rotating body so that a film can be formed continuously, film forming can be carried out efficiently as compared with the case of the passing film forming.

Also, in the present invention, the configuration may be such that either of the first sputter film forming means and the second sputter film forming means is provided. In the case where only the second sputter film forming means is provided, since the substrate and the substrate tray are held on the inside of the cylindrical rotating body, at the time of rotating film forming, the substrate can be prevented from coming off due to a centrifugal force.

Further, in the present invention, since the substrate tray is fixed by a magnetic force, even when the substrate tray is not rotated, the substrate tray can be prevented from coming off. Therefore, the substrate trays mounted on the cylindrical rotating body can be replaced one after another while the cylindrical rotating body is rotated stepwise.

Also, in the present invention, the construction for fixing the substrate tray can be simplified.

Further, in the present invention, since the electromagnet is used for mounting and demounting, the substrate tray can be mounted and demounted by the substrate mounting/demounting means.

Also, since the cylindrical rotating body is rotated around a substantially horizontal rotation axis, the substrate tray is transported horizontally, so that the construction can be simplified.

DESCRIPTION OF SYMBOLS

Figure 1:
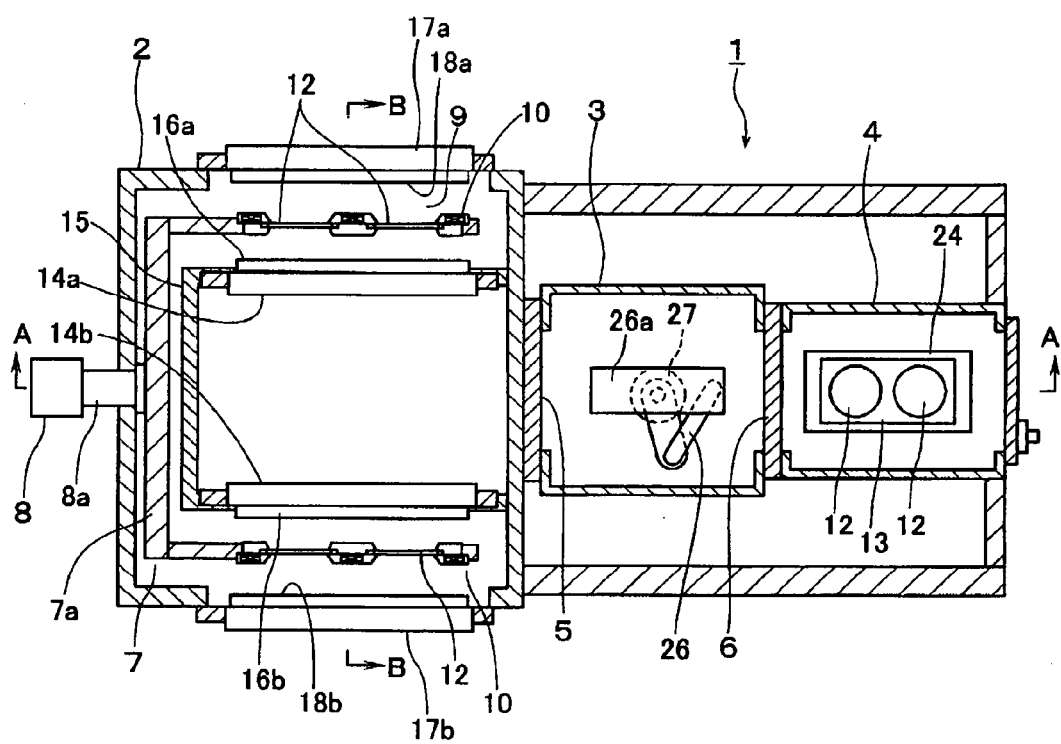
FIG. 1 is a schematic sectional view of a film forming apparatus in accordance with an embodiment of the present invention which carries out double-side film forming, viewed from the upper surface side.

1 film forming apparatus
2 film forming chamber
3 transportation chamber
4 feed/discharge chamber
5, 6 sluice valve base plate
7 rotating drum
10 substrate holder
11*a*, 11*b*, 11*c* permanent magnet
12 substrate
13 substrate tray
14*a*, 14*b* cathode for inner surface
16*a*, 16*b* target for inner surface
17*a*, 17*b* cathode for outer surface
18*a*, 18*b* target for outer surface
19 tray elevating member
22*a*, 22*b*, 22*c* electromagnet
26 arm
26*a* substrate hand portion

BEST MODE FOR CARRYING OUT THE INVENTION

The present invention will now be explained based on an embodiment shown in the drawings.

Figure 2:
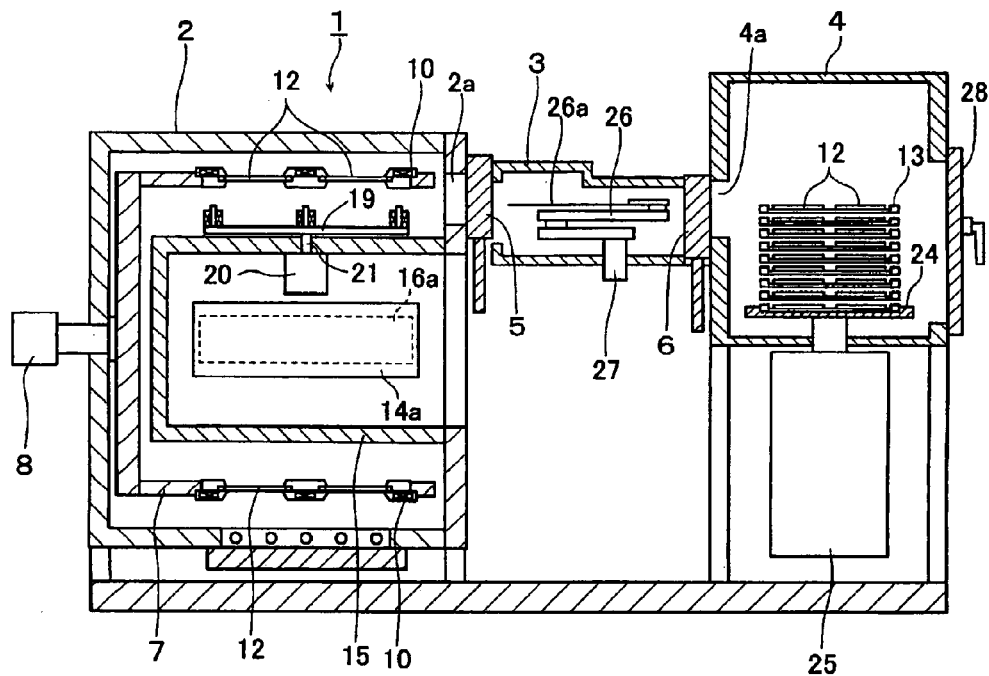
FIG. 2 is a sectional view taken along the line A-A of FIG. 1.
Figure 3:
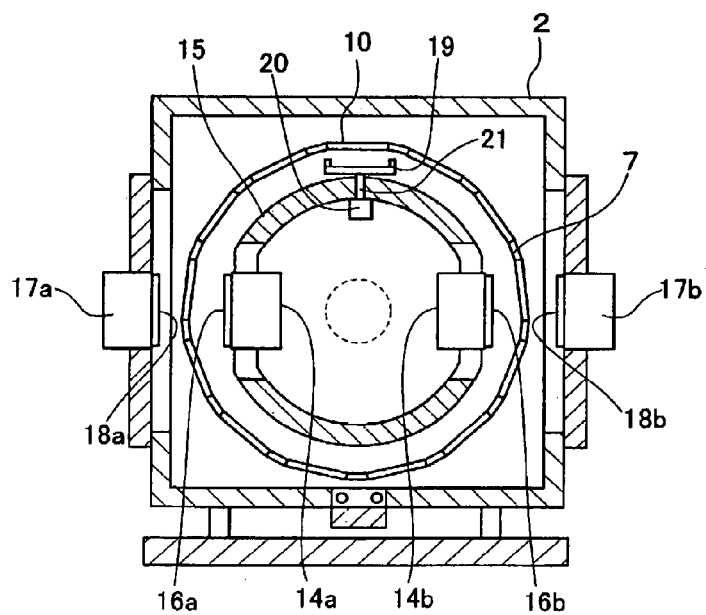
FIG. 3 is a sectional view taken along the line B-B of FIG. 1.

FIG. 1 is a schematic sectional view of a film forming apparatus in accordance with an embodiment of the present invention which carries out double-side film forming, viewed from the upper surface side, FIG. 2 is a sectional view taken along the line A-A of FIG. 1, and FIG. 3 is a sectional view taken along the line B-B of FIG. 1.

This film forming apparatus 1 is provided with a film forming chamber 2, a transportation chamber 3, and a feed/discharge chamber 4, and sluice valves 5 and 6 are provided between the film forming chamber 2 and the transportation chamber 3 and between the transportation chamber 3 and the feed/discharge chamber 4, respectively. In the film forming chamber 2, a rotating drum 7 having a substantially cylindrical outer peripheral surface is rotatably provided with the axis line direction thereof being horizontal. One side surface (the transportation chamber 3 side) of the rotating drum 7 is open, and to the center of the other side surface (the side opposite to the transportation chamber 3) 7a of the rotating drum 7 is connected a driving shaft 8a connecting with a drive motor 8.

Figure 4:
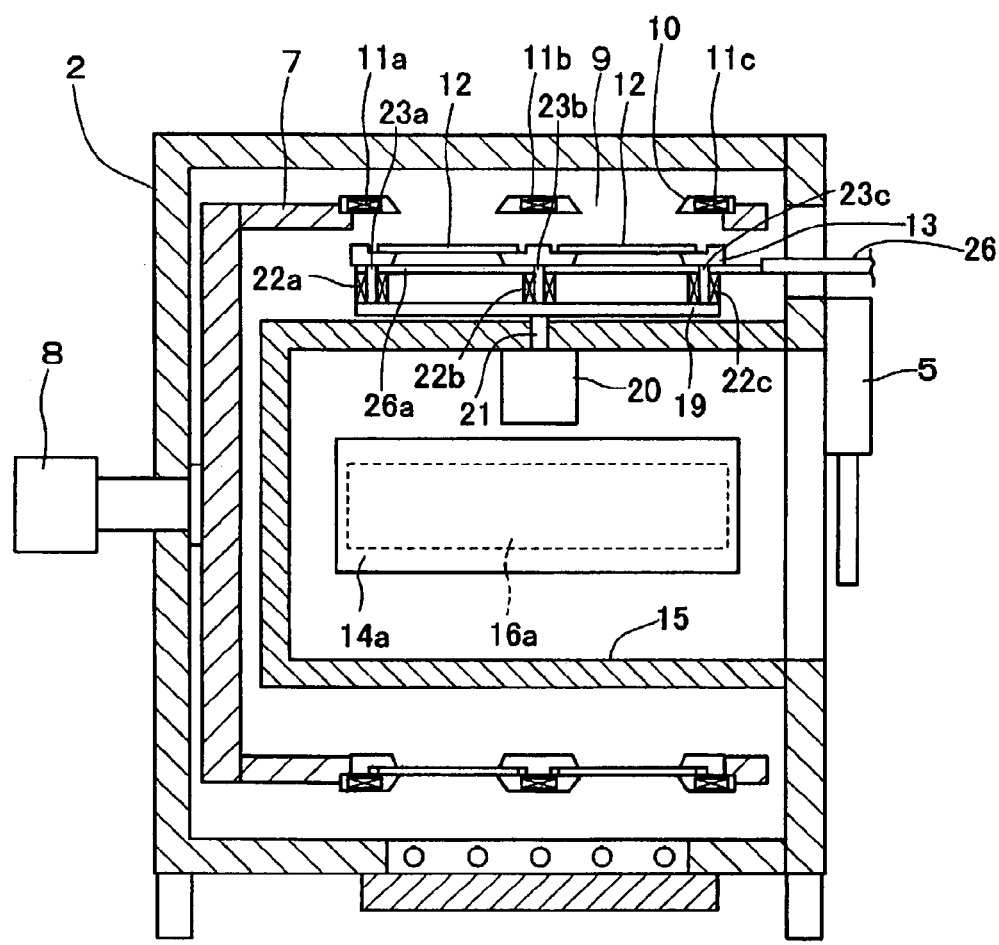
FIG. 4 is a schematic sectional view showing a state in which a substrate tray on which two substrates are placed is mounted on a tray elevating member in a film forming chamber.

On the peripheral surface of the rotating drum 7, substrate holders 10 are provided in a plurality of (thirteen in this embodiment) rectangularly shaped openings 9 formed along the circumferential direction (refer to FIG. 3), and in both edge portions and in the central portion on the upper surface side of each of the substrate holders 10, permanent magnets 11a, 11b and 11c are provided (refer to FIG. 4). The substrate holder 10 is formed so as to correspond to the size of a rectangularly shaped substrate tray 13 that holds two substrates 12, and portions between the permanent magnets 11a, 11b and 11c are open so as to correspond to the size of the substrate 12.

On the inside of the rotating drum 7, a cylindrical member 15 mounted with horizontally rectangular cathodes 14a and 14b for inner surface, the cathodes 14a and 14b for inner surface being provided so as to face each other with the center of rotation being held therebetween. Onto the outside surfaces of the cathodes 14a and 14b for inner surface, targets 16a and 16b for inner surface are attached, respectively. One side surface (the transportation chamber 3 side) of the cylindrical member 15 is fixed in close contact to the inside wall surface of the film forming chamber 2, and the other side surface (the side opposite to the transportation chamber 3) of the cylindrical member 15 is enclosed.

Also, on both side surfaces of the film forming chamber 2, horizontally rectangular cathodes 17a and 17b for outer surface are provided so as to face the cathodes 14a and 14b for inner surface, respectively, with the rotating drum 7 being held therebetween. Onto the inside surfaces of the cathodes 17a and 17b for outer surface, targets 18a and 18b for outer surface are attached, respectively. To the cathodes 14a and 14b for inner surface and the cathodes 17a and 17b for outer surface, a sputter power source (not shown) is connected.

As shown in FIGS. 2 and 4, on the upper surface in the vertical direction of the cylindrical member 15, a tray elevating member 19 for raising and lowering the substrate tray 13 is provided via an elevation shaft 21 capable of extension and contraction so as to correspond to the position of the substrate holder 10 of the rotating drum 7, so that the tray elevating member 19 is raised and lowered by the extension and contraction of the elevation shaft 21 caused by the driving of an elevation driving portion 20 provided in the cylindrical member 15. On the upper surface of the tray elevating member 19, electromagnets 22a, 22b and 22c are provided so as to correspond to the positions of the permanent magnets 11a, 11b and 11c of the rotating drum 7. On both end sides of each of the electromagnets 22a, 22b and 22c, protruding members 23a, 23b, 23c each consisting of an insulating member are provided so as to protrude slightly from the tip end of the electromagnet 22a, 22b, 22c.

To the film forming chamber 2, a gas introduction system (not shown) for introducing a gas such as a source gas into a space in which the rotating drum 7 is located (a space formed between the inside wall surface of the film forming chamber 2 and the outer peripheral surface of the cylindrical member 15) and an exhaust system (not shown) for exhausting this space to control the pressure are connected. Also, to the feed/discharge chamber 4, an exhaust system (not shown) for exhausting this chamber to control the pressure and a gas introduction system (not shown) for venting are connected. Further, to the transportation chamber 3 as well, an exhaust system (not shown) for exhausting this chamber to control the pressure is connected.

In the side surface on the transportation chamber 3 side of the film forming chamber 2 in which the upper surface of the rotating drum 7 is located, as shown in FIG. 2, an opening 2a is formed, and on the outside of this opening 2a, the transportation chamber 3 is provided via the sluice valve 5. Also, on the side surface of the transportation chamber 3 on the side opposite to the film forming chamber 2, the feed/discharge chamber 4 is provided via the sluice valve 6 provided in an opening 4a. In the feed/discharge chamber 4, a shelf 24 is provided to store a plurality of substrate trays 13 each of which holds two substrates 12. The shelf 24 is moved up and down by the driving of a cassette elevating device 25 connected to the shelf 24. The substrate tray 13 holds the end portion sides of two substrates 12 so that both surfaces of each of the substrates 12 on which a film is formed are exposed. Also, the substrate tray 13 is formed of a magnetic material (for example, SUS430).

In the transportation chamber 3, an arm 26 capable of extension and contraction, which has a substrate hand portion 26a at the tip end thereof is turnably provided. The arm 26 is connected to a driving section 27. Due to the turning operation of the arm 26, the substrate hand portion 26a holds the substrate tray 13 in the feed/discharge chamber 4 and transports it onto the tray elevating member 19 in the film forming chamber 2 when a film is formed, and holds the substrate tray 13 mounted on the tray elevating member 19 and transports it onto the shelf 24 in the feed/discharge chamber 4 after the film has been formed.

Next, a method for forming a film by using the film forming apparatus 1 of the above-described embodiment will be explained.

First, the film forming chamber 2, the transportation chamber 3, and the feed/discharge chamber 4 are exhausted so that the pressure therein is controlled (decreased) to a predetermined value by operating the exhaust systems (not shown) in a state in which the sluice valve 5 of the film forming chamber 2 and the sluice valve 6 of the feed/discharge chamber 4 are opened. Then, the driving section 27 is driven to turn and extend the arm 26, by which the substrate hand portion 26a is inserted under the substrate tray 13 holding the untreated substrates 12, which is housed on a cassette 24 in the feed/discharge chamber 4. Thereafter, by the driving of the cassette elevating device 25, the cassette 24 is lowered slightly to place the substrate tray 13 on the substrate hand portion 26a.

After the arm 26 has been contracted to take the substrate tray 13 into the transportation chamber 3, as shown in FIG. 4, the arm 26 is turned and extended, by which the substrate tray 13 is transported onto the tray elevating member 19 located on the upper side of the film forming chamber 2. At this time, as shown in FIG. 4, the substrate tray 13 on the substrate hand portion 26a is in a state of being placed on the protruding members 23a, 23b and 23c of the tray elevating member 19, and the substrate holder 10 of the rotating drum 7 is located above the tray elevating member 19. Also, at this time, the electromagnets 22a, 22b and 22c are in a deenergized state.

Figure 5:
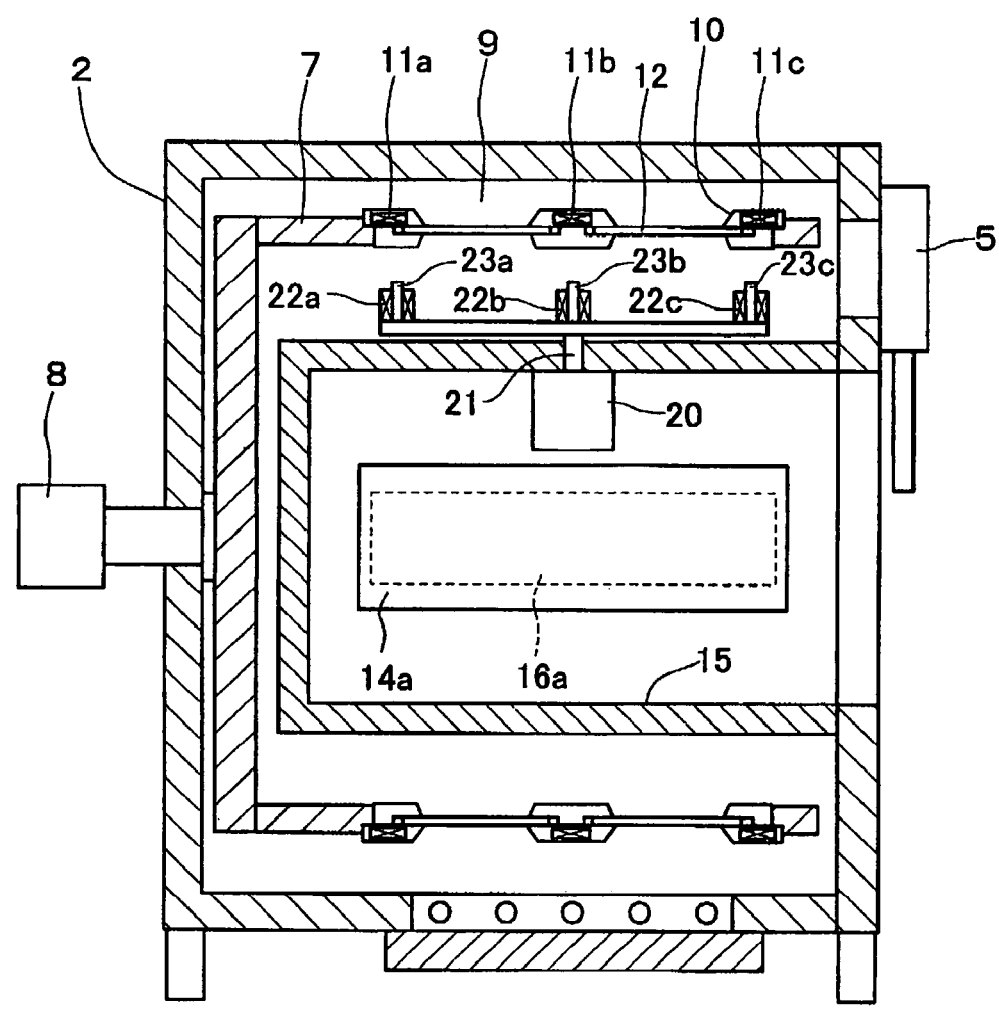
FIG. 5 is a schematic sectional view showing a state in which a substrate tray on which two substrates are placed is held by magnetic attraction.

After the substrate hand portion 26a and the arm 26 have been moved into the transportation chamber 3, the elevation shaft 21 is extended by the driving of the elevation driving portion 20 to raise the tray elevating member 19, by which the substrate tray 13 is brought into contact with the substrate holder 10 of the rotating drum 7. Thereby, as shown in FIG. 5, the substrate tray 13 formed of a magnetic material is attracted to and held on the substrate holder 10 by the magnetic forces of the permanent magnets 11a, 11b and 11c. Subsequently, the tray elevating member 19 is lowered to the original position.

Then, the rotating drum 7 is rotated slightly to move the adjacent next substrate holder 10 to above the tray elevating member 19. The substrate tray 13 transported into the film forming chamber 2 by the substrate hand portion 26a as described above is placed on the protruding members 23a, 23b and 23c of the tray elevating member 19, and the tray elevating member 19 is raised, by which the substrate tray 13 is attracted to and held on the substrate holder 10 by the magnetic forces of the permanent magnets 11a, 11b and 11c. The above-described operation is repeated, by which the substrate trays 13 holding the untreated substrates 12 are attracted to and held on the substrate holders 10 of the rotating drum 7 by the magnetic force.

After the sluice valves 5 and 6 have been closed, the film forming chamber 2 is exhausted by the exhaust system (not shown) to control the pressure therein to a value at the time of film forming. Thereafter, an inert gas (generally, argon gas) is introduced from the gas introduction system (not shown) into the film forming chamber 2, and the pressure in the film forming chamber 2 is held at a fixed value by driving the exhaust system (not shown). At this time, the drive motor 8 is driven to rotate the rotating drum 7 at a predetermined number of revolutions. In this state, a d.c. voltage or an a.c. voltage or a high-frequency voltage is applied to the cathodes 14a and 14b for inner surface and the cathodes 17a and 17b for outer surface from a sputter power source (not shown), by which plasma due to electric discharge is generated.

Thereby, positive ions of ionized inert gas collide with the surfaces of the targets 16a and 16b for inner surface and the targets 18a and 18b for outer surface, so that sputter atoms (for example, Si, Ti, etc.) emit and fly to adhere to both surfaces of two substrates 12 held by the substrate holder 10 at this position, by which both surfaces of the substrates 12 are subjected to sputter film forming. As the rotating drum 7 is rotated, a multilayer film is formed on the two substrates 12 held by the substrate trays 13, and the film is formed so as to have a predetermined film thickness.

With this method, at the sputter film forming time at which the substrate 12 is located between the target 16a, 16b for inner surface and the target 18a, 18b for outer surface, the substrate 12 on the substrate tray 13 attracted to and held on each substrate holder 10 of the rotating drum 7 is heated by plasma etc., and the temperature thereof increases (for example, the substrate temperature rises to about 150° C.), but at the time when the substrate 12 is located at any positions other than this position, the rise in temperature of the substrate 12 on the substrate tray 13 is restrained because the substrate 12 is not in contact with the above-described heating source (plasma etc.). Thereby, the temperature of the substrate 12 on the substrate tray 13 at the film forming time is kept from rising to a predetermined value or higher without the use of a substrate cooling means, so that satisfactory film forming can be carried out continuously with high efficiency.

When the sputter film forming onto the substrates 12 on the substrate trays 13 attracted to and held on the substrate holders 10 of the rotating drum 7 is finished, the rotating drum 7 is stopped in such a manner that the substrate holder 10 that was carried in first is located above the tray elevating member 19, and thereafter the sluice valves 5 and 6 are opened. Even in the state in which the sluice valves 5 and 6 are open, the film forming chamber 2, the transportation chamber 3, and the feed/discharge chamber 4 keep the predetermined (decreased) pressure.

From the state shown in FIG. 5, the elevation shaft 21 is extended by the driving of the elevation driving portion 20 to raise the tray elevating member 19, to bring the protruding members 23a, 23b and 23c into contact with the substrate tray 13 attracted to and held on the substrate holder 10 of the rotating drum 7. At this time, the electromagnets 22a, 22b and 22c are energized to generate a magnetic force. The magnetic force of the electromagnets 22a, 22b and 22c is, for example, about twice as strong as the magnetic force of the permanent magnets 11a, 11b and 11c.

The elevation shaft 21 is contracted by the driving of the elevation driving portion 20 to lower the tray elevating member 19, by which the substrate tray 13 is separated from the magnetic forces of the permanent magnets 11a, 11b and 11c by the magnetic forces generated by the electromagnets 22a, 22b and 22c having magnetic forces stronger than those of the permanent magnets 11a, 11b and 11c, and is lowered slightly together with the tray elevating member 19 (refer to FIG. 5).

The arm 26 is then turned and extended so that the substrate hand portion 26a is inserted between the tray elevating member 19 located on the upper side of the film forming chamber 2 and the substrate tray 13 (refer to FIG. 4). At this time, the electromagnets 22a, 22b and 22c are deenergized. After the tray elevating member 19 has further been lowered to place the substrate tray 13 on the substrate hand portion 26a, the arm 26 is contracted and taken in the transportation chamber 3. Thereafter, the arm 26 is further turned and extended so that the substrate tray 13 holding two substrates 12 that are subjected to sputter film forming on both surfaces thereof is stored on the cassette 24 in the feed/discharge chamber 4. By repeating the above-described procedure, the substrate trays 13 holding two substrates 12 that are subjected to sputter film forming on both surfaces thereof are moved from the substrate holders 10 of the rotating drum 7 onto the tray elevating member 19, and thereafter are placed on the substrate hand portion 26a so that the substrate trays 13 are stored in succession on the shelf 24 in the feed/discharge chamber 4.

After the sluice valves 5 and 6 have been closed, a door 28 of the feed/discharge chamber 4 is opened to take out the substrate trays 13 holding two substrates 12 that are subjected to sputter film forming on both surfaces thereof from the feed/discharge chamber 4 that is in an atmospheric condition. Subsequently, untreated substrates are stored on the cassette 24.

The invention claimed is:
1. A film forming apparatus comprising:
a circular or polygonal cylindrical rotating body which is rotatably around a horizontal axis provided in a film forming chamber the pressure of which can be controlled;
a rotating body driving means for rotationally driving the cylindrical rotating body;

a first sputter film forming means provided so as to face the outer surface side of the cylindrical rotating body;

a second sputter film forming means provided so as to face the inner surface side of the cylindrical rotating body;

a substrate tray on which a substrate is placed so that the edge portions of the substrate are held and the top surface and the back surface of the substrate are exposed;

a substrate holder which is provided in an opening formed in the peripheral surface of the cylindrical rotating body to detachably hold the substrate tray so that the top surface and the back surface of the substrate are exposed; and means for securing releasably holding the substrate holder magnetically which encounters the inner circumferential surface of the cylindrical rotating body and which holds the substrate onto the inner circumferential surface of the cylindrical rotating body;

wherein a film is formed on the top surface of the substrate on the substrate tray held on the substrate holder by using the first sputter film forming means, and a film is formed on the back surface of the substrate on the substrate tray held on the substrate holder by using the second sputter film forming means, in the film forming chamber the pressure of which is controlled, while the cylindrical rotating body is rotated by the driving of the rotating body driving means.

2. The film forming apparatus according to claim 1, wherein the cylindrical rotating body is provided so that the axis line direction thereof is substantially horizontal.

3. The film forming apparatus according to claim 1, wherein a plurality of the substrate holders are provided along the circumferential direction of the cylindrical rotating body.

4. The film forming apparatus according to any one of claims 1 to 3,
wherein a substrate mounting/demounting means for mounting and demounting the substrate tray on and from the substrate holder is provided in the film forming chamber.

5. The film forming apparatus according to claim 4,
wherein the means for magnetically holding include the substrate holder having a magnet, and the substrate tray having magnetism, and further the substrate mounting/demounting means has an electromagnet the magnetic force of which is larger than that of the magnet;

when the substrate tray is mounted on the substrate holder, the electromagnet is deenergized, and the substrate tray held on the substrate mounting/demounting means is moved to the substrate holder side, and the substrate tray having magnetism is brought close to the magnet, by which the substrate tray is held on the substrate holder by the magnetic force due to the magnet; and when the substrate tray is demounted from the substrate holder, the substrate mounting/demounting means is moved close to the substrate holder, and the electromagnet is energized, by which the substrate tray is separated from the substrate holder by the magnetic force due to the electromagnet against the magnetic force due to the magnet, and the substrate tray is held on the substrate mounting/demounting means by the magnetic force due to the electromagnet.

6. The film forming apparatus according to any one of claims 1 to 3,
wherein a plurality of the first sputter film forming means are provided so as to face the outer surface side of the cylindrical rotating body with predetermined intervals being provided, and a plurality of the second sputter film forming means are provided so as to face the inner surface side of the cylindrical rotating body with predetermined intervals being provided.

7. The film forming apparatus according to claim 4,
wherein in a transportation chamber provided adjacently to the film forming chamber via a first sluice valve, there is provided a substrate tray transporting means which transports the substrate tray from the transportation chamber to the substrate mounting/demounting means in the film forming chamber through the sluice valve in a state in which the pressures in the film forming chamber and the transportation chamber are controlled, and also transports the substrate tray from the substrate mounting/demounting means in the film forming chamber to the transportation chamber through the opened sluice valve.

8. The film forming apparatus according to claim 7,
wherein a feed/discharge chamber having a shelf for storing the substrate tray is provided adjacently to the transportation chamber via a second sluice valve, so that the substrate tray is transported from the transportation chamber onto the shelf in the feed/discharge chamber through the opened second sluice valve by the substrate tray transporting means in a state in which the pressures in the transportation chamber and the feed/discharge chamber are controlled, and also the substrate tray stored on the shelf is transported into the transportation chamber.

9. A film forming apparatus for forming a film on a substrate in a vacuum vessel, having:
a circular or polygonal cylindrical rotating body provided rotatably around a horizontal axis;
a substrate tray which holds the substrate and is detachably fixed on the inner surface of the cylindrical rotating body;
a film forming means provided so as to face the outer peripheral circumferential surface of the cylindrical rotating body; and
means for securing releasably holding the substrate holder magnetically which encounters the inner circumferential surface of the cylindrical rotating body and which holds the substrate onto the inner circumferential surface of the cylindrical rotating body;
wherein the cylindrical rotating body has an opening at least in a portion corresponding to the film forming range of the substrate, and a film is formed on the substrate while the cylindrical rotating body is rotated.

10. A film forming apparatus for forming a film on a substrate in a vacuum vessel, having:
a circular or polygonal cylindrical rotating body provided rotatably around a horizontal axis;
a substrate tray which holds the substrate and is detachably fixed on the inner surface of the cylindrical rotating body;
a film forming means provided so as to face the inner circumferential surface of the cylindrical rotating body; and
means for securing releasably holding the substrate holder magnetically which encounters the inner circumferential surface of the cylindrical rotating body and which holds the substrate onto the inner circumferential surface of the cylindrical rotating body;
wherein a film is formed on the substrate while the cylindrical rotating body is rotated.

11. The film forming apparatus according to claim 9,
wherein a substrate mounting/demounting means for transferring the substrate tray to the inside of the cylindrical rotating body is provided;
the substrate mounting/demounting means has an electromagnet having a magnetic force larger than that of the magnet; and
when the substrate tray is held on the inner surface of the cylindrical rotating body, the electromagnet is deenergized, and when the substrate tray is removed from the inner surface of the cylindrical rotating body and is held by the substrate mounting/demounting means, the electromagnet is energized.

12. The film forming apparatus according to any one of claims 9, 10, or 11,
wherein the cylindrical rotating body is rotated around a substantially horizontal rotation axis.

13. The film forming apparatus according to claim 2,
wherein a plurality of the substrate holders are provided along the circumferential direction of the cylindrical rotating body.

14. The film forming apparatus according claim 13,
wherein a substrate mounting/demounting means for mounting and demounting the substrate tray on and from the substrate holder is provided in the film forming chamber.

15. The film forming apparatus according to claim 14,
wherein the means for magnetically holding include the substrate holder having a magnet, and the substrate tray having magnetism, and further the substrate mounting/demounting means has an electromagnet the magnetic force of which is larger than that of the magnet;
when the substrate tray is mounted on the substrate holder, the electromagnet is deenergized, and the substrate tray held on the substrate mounting/demounting means is moved to the substrate holder side, and the substrate tray having magnetism is brought close to the magnet, by which the substrate tray is held on the substrate holder by the magnetic force due to the magnet; and
when the substrate tray is demounted from the substrate holder, the substrate mounting/demounting means is moved close to the substrate holder, and the electromagnet is energized, by which the substrate tray is separated from the substrate holder by the magnetic force due to the electromagnet against the magnetic force due to the magnet, and the substrate tray is held on the substrate mounting/demounting means by the magnetic force due to the electromagnet.

16. The film forming apparatus according to claim 4,
wherein a plurality of the first sputter film forming means are provided so as to face the outer surface side of the cylindrical rotating body with predetermined intervals being provided, and a plurality of the second sputter film forming means are provided so as to face the inner surface side of the cylindrical rotating body with predetermined intervals being provided.

17. The film forming apparatus according to claim 13,
wherein a plurality of the first sputter film forming means are provided so as to face the outer surface side of the cylindrical rotating body with predetermined intervals being provided, and a plurality of the second sputter film forming means are provided so as to face the inner surface side of the cylindrical rotating body with predetermined intervals being provided.

18. The film forming apparatus according to claim 14,
wherein a plurality of the first sputter film forming means are provided so as to face the outer surface side of the cylindrical rotating body with predetermined intervals being provided, and a plurality of the second sputter film forming means are provided so as to face the inner surface side of the cylindrical rotating body with predetermined intervals being provided.

19. The film forming apparatus according to claim 15,
wherein a plurality of the first sputter film forming means are provided so as to face the outer surface side of the cylindrical rotating body with predetermined intervals being provided, and a plurality of the second sputter film forming means are provided so as to face the inner surface side of the cylindrical rotating body with predetermined intervals being provided.

20. The film forming apparatus according to claim 5,
wherein in a transportation chamber provided adjacently to the film forming chamber via a sluice valve, there is provided a substrate tray transporting means which transports the substrate tray from the transportation chamber to the substrate mounting/demounting means in the film forming chamber through the sluice valve in a state in which the pressures in the film forming chamber and the transportation chamber are controlled, and also transports the substrate tray from the substrate mounting/demounting means in the film forming chamber to the transportation chamber through the opened sluice valve.

21. The film forming apparatus according to claim 14,
wherein in a transportation chamber provided adjacently to the film forming chamber via a sluice valve, there is provided a substrate tray transporting means which transports the substrate tray from the transportation chamber to the substrate mounting/demounting means in the film forming chamber through the sluice valve in a state in which the pressures in the film forming chamber and the transportation chamber are controlled, and also transports the substrate tray from the substrate mounting/demounting means in the film forming chamber to the transportation chamber through the opened sluice valve.

22. The film forming apparatus according to claim 15,
wherein in a transportation chamber provided adjacently to the film forming chamber via a sluice valve, there is provided a substrate tray transporting means which transports the substrate tray from the transportation chamber to the substrate mounting/demounting means in the film forming chamber through the sluice valve in a state in which the pressures in the film forming chamber and the transportation chamber are controlled, and also transports the substrate tray from the substrate mounting/demounting means in the film forming chamber to the transportation chamber through the opened sluice valve.

23. The film forming apparatus according to claim 20,
wherein a feed/discharge chamber having a shelf for storing the substrate tray is provided adjacently to the transportation chamber via a sluice valve, so that the substrate tray is transported from the transportation chamber onto the shelf in the feed/discharge chamber through the opened sluice valve by the substrate tray transporting means in a state in which the pressures in the transportation chamber and the feed/discharge chamber are controlled, and also the substrate tray stored on the shelf is transported into the transportation chamber.

24. The film forming apparatus according to claim 21,
wherein a feed/discharge chamber having a shelf for storing the substrate tray is provided adjacently to the transportation chamber via a sluice valve, so that the substrate tray is transported from the transportation chamber onto the shelf in the feed/discharge chamber through the opened sluice valve by the substrate tray transporting means in a state in which the pressures in the transportation chamber and the feed/discharge chamber are controlled, and also the substrate tray stored on the shelf is transported into the transportation chamber.

25. The film forming apparatus according to claim 22, wherein a feed/discharge chamber having a shelf for storing the substrate tray is provided adjacently to the transportation chamber via a sluice valve, so that the substrate tray is transported from the transportation chamber onto the shelf in the feed/discharge chamber through the opened sluice valve by the substrate tray transporting means in a state in which the pressures in the transportation chamber and the feed/discharge chamber are controlled, and also the substrate tray stored on the shelf is transported into the transportation chamber.

26. The film forming apparatus according to claim 10,
wherein a substrate mounting/demounting means for transferring the substrate tray to the inside of the cylindrical rotating body is provided;
the substrate mounting/demounting means has an electromagnet having a magnetic force larger than that of the magnet; and
when the substrate tray is held on the inner surface of the cylindrical rotating body, the electromagnet is deenergized, and when the substrate tray is removed from the inner surface of the cylindrical rotating body and is held by the substrate mounting/demounting means, the electromagnet is energized.

27. The film forming apparatus according to claim 26, wherein the cylindrical rotating body is rotated around a substantially horizontal rotation axis.

* * * * *